United States Patent
Hsu et al.

(10) Patent No.: US 11,380,385 B1
(45) Date of Patent: Jul. 5, 2022

(54) MEMORY DEVICE

(71) Applicant: NANYA TECHNOLOGY CORPORATION, New Taipei (TW)

(72) Inventors: Ting-Shuo Hsu, New Taipei (TW); Chih-Wei Shen, Yunlin County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/147,480

(22) Filed: Jan. 13, 2021

(51) Int. Cl.
| | |
|---|---|
| *G11C 11/4074* | (2006.01) |
| *G11C 11/4093* | (2006.01) |
| *G11C 11/4096* | (2006.01) |
| *G11C 5/06* | (2006.01) |

(52) U.S. Cl.
CPC ............ *G11C 11/4074* (2013.01); *G11C 5/06* (2013.01); *G11C 11/4093* (2013.01); *G11C 11/4096* (2013.01)

(58) Field of Classification Search
CPC ............ G11C 11/4074; G11C 11/4096; G11C 11/4093; G11C 5/06
See application file for complete search history.

(56) References Cited

U.S. PATENT DOCUMENTS

2016/0343441 A1* 11/2016 Abiko ................. H01L 25/0657
2021/0210134 A1* 7/2021 Ning .................... H01L 25/0652

* cited by examiner

*Primary Examiner* — Tri M Hoang
(74) *Attorney, Agent, or Firm* — CKC & Partners Co., LLC

(57) ABSTRACT

A memory device includes an input pad, a first rank, a second rank, a first voltage detector, and a second voltage detector. The input pad is configured to receive an input voltage. The first voltage detector is coupled to the input pad, the first voltage detector is configured to receive the input voltage, and the first voltage detector is configured to transmit the input voltage to the first rank. The second voltage detector is coupled to the first voltage detector through a first through-silicon via, the second voltage detector is configured to receive the input voltage, and the second voltage detector is configured to transmit the input voltage to the second rank according to a control signal transmitted from the first voltage detector through the first voltage detector, so as to decide a state of the second rank.

13 Claims, 2 Drawing Sheets

MEMORY DEVICE

BACKGROUND

Field of Invention

The present disclosure relates to a memory device. More particularly, the present disclosure relates to a memory device having different voltage detectors to control ranks of a memory device.

Description of Related Art

In current memory device, a dynamic random access memory (DRAM) includes 2 to 8 ranks. Each of ranks will be enable by a control signal, and all ranks are in an enable state. It causes more power consumption in un-work rank of the DRAM.

For the foregoing reason, there is a need to provide some other suitable control structure of the memory device to solve the problems of the prior art.

SUMMARY

One aspect of the present disclosure provides a memory device. The memory device includes an input pad, a first rank, a second rank, a first voltage detector, and a second voltage detector. The input pad is configured to receive an input voltage. The first voltage detector is coupled to the input pad, the first voltage detector is configured to receive the input voltage, and the first voltage detector is configured to transmit the input voltage to the first rank. The second voltage detector is coupled to the first voltage detector through a first through-silicon via, the second voltage detector is configured to receive the input voltage, and the second voltage detector is configured to transmit the input voltage to the second rank according to a control signal transmitted from the first voltage detector through the first voltage detector, so as to decide a state of the second rank.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
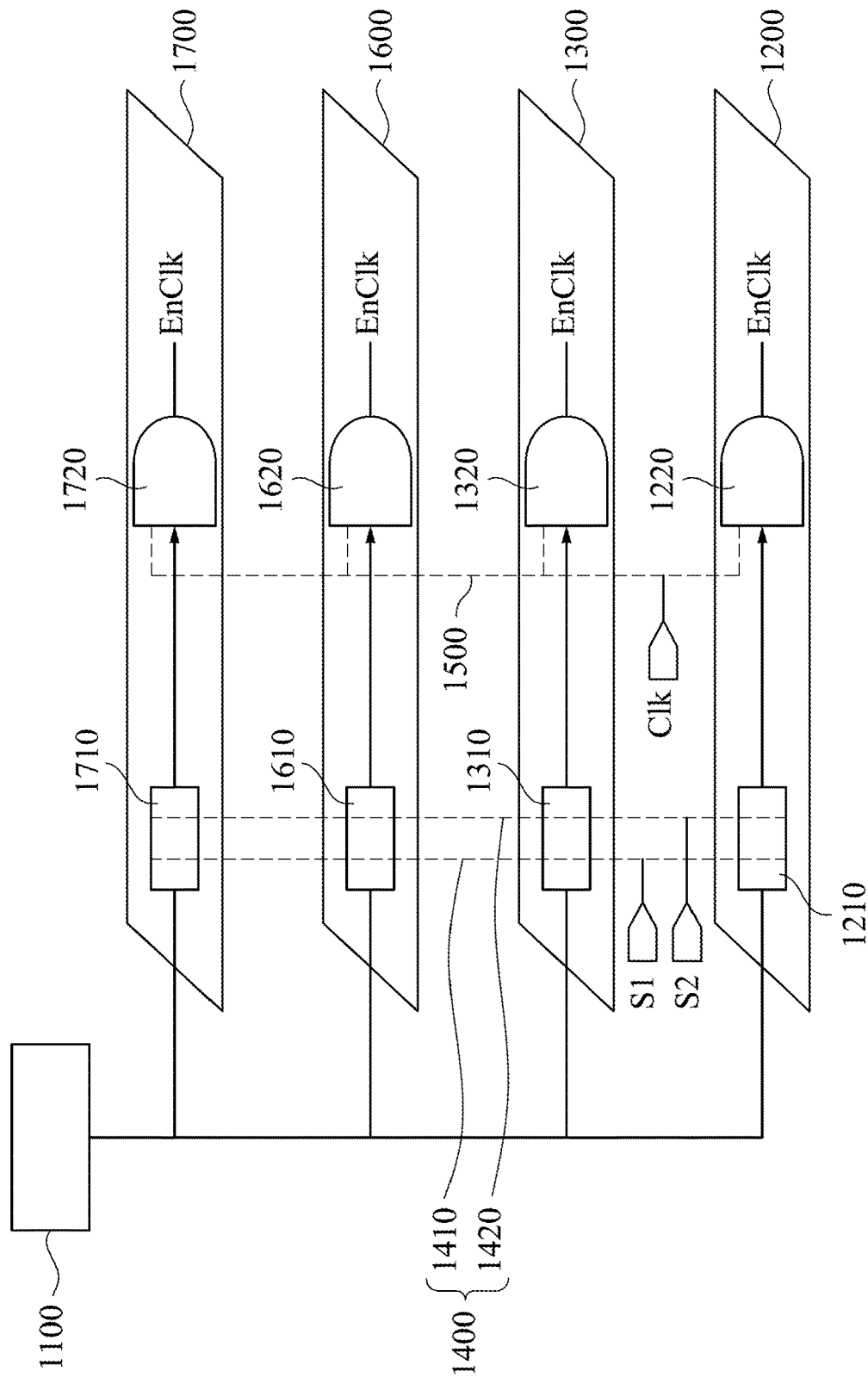
FIG. 1 depicts a schematic diagram of a memory device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of a memory device according to one embodiment of the present disclosure. In some embodiments, please refer to FIG. 1, the memory device 1000 includes an input pad 1100, a first rank 1200, a second rank 1300, a first voltage detector 1210, and a second voltage detector 1310. In another embodiment, the memory device 1000 includes a dynamic random access memory (DRAM).

In some embodiments, the input pad 1100 is configured to receive an input voltage. The first voltage detector 1210 is coupled to the input pad 1100. The first voltage detector 1210 is configured to receive the input voltage, and transmit the input voltage to the first rank 1200. The second voltage detector 1310 is coupled to the first voltage detector 1210 through a first through-silicon via 1400. The second voltage detector 1310 is configured to receive the input voltage, and transmit the input voltage to the second rank 1300 according to a control signal transmitted from the first voltage detector 1210 through the first voltage detector 1210, so as to decide a state of the second rank 1300.

In some embodiments, the first rank 1200 is a master rank, and is always in an enable state. The second rank 1300 is a slave rank. In some embodiments, the first rank 1200 and the second rank 1300 are located in different layers of the memory device 1000.

In some embodiments, the memory device 1000 includes other slave ranks, for example, a third rank 1600 and a fourth rank 1700. The structure and the function of the third rank 1600 and a fourth rank 1700 are the same as that of the second rank 1300.

In some embodiments, the memory device 1000 further includes a first logic gate 1220 and a second logic gate 1320. The first logic gate 1220 is coupled between the first voltage detector 1210 and the first rank 1200. The second logic gate 1320 is coupled between the second voltage detector 1310 and the second rank 1300, and is coupled to the first logic gate 1220 through a second through-silicon via 1500. The second logic gate 1320 is configured to receive a clock signal Clk from the second through-silicon via 1500 to drive the second rank 1300 in an enable state. In some embodiments, the memory device 1000 further includes the third logic gate 1620 and the fourth logic gate 1720. The first logic gate 1220, the second logic gate 1320, the third logic gate 1620, and the fourth logic gate 1720 are coupled together through the second through-silicon via 1500. The structure and the function the first logic gate 1220, the second logic gate 1320, the third logic gate 1620, and the fourth logic gate 1720 are all the same.

In some embodiments, please refer to FIG. 1, each of the first logic gate 1220 and the second logic gate 1320 includes at least one of logical NOR gate, logical OR gate, and logical AND gate. The first logic gate 1220 and the second logic gate 1320 receive and decode a command from a DRAM controller (not shown in figure).

In some embodiments, the first through-silicon via 1400 is perpendicular to the first rank 1200, and the second through-silicon via 1500 is perpendicular to the second rank 1300.

In some embodiments, the first through-silicon via 1400 includes two first through-silicon vias, for example, a first through-silicon via 1410 and a first through-silicon via 1420.

Figure 2:
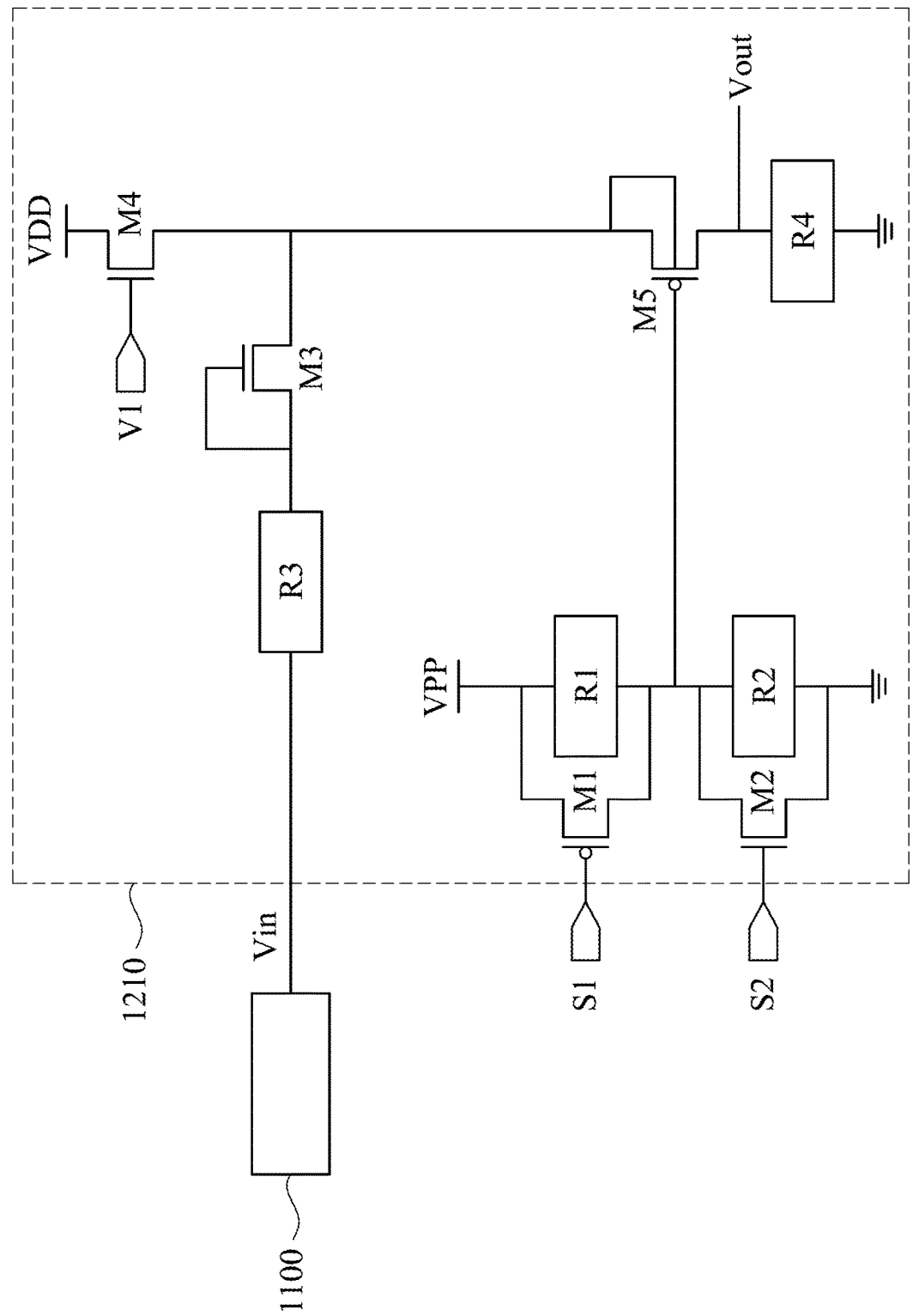
FIG. 2 depicts a schematic diagram of a voltage detector of the memory device shown in FIG. 1 according to one embodiment of the present disclosure.

FIG. 2 depicts a schematic diagram of a voltage detector of the memory device shown in FIG. 1 according to one embodiment of the present disclosure. In some embodiments, please refer to FIG. 1 to FIG. 2, the voltage detector 1210 shown in FIG. 2 is corresponding to the first voltage detector 1210 shown in FIG. 1. The first voltage detector 1210, the second voltage detector 1310, the third voltage detector 1610, and the fourth voltage detector 1710 are coupled together through the first through-silicon via 1400. The structure and the function of the first voltage detector 1210, the second voltage detector 1310, the third voltage detector 1610, and the fourth voltage detector 1710 are all the same.

In some embodiments, each of voltage detectors includes a first transistor M1, a second transistor M2, a third transistor M3, a fourth transistor M4, a fifth transistor M5, a first resistor R1, a second resistor R2, a third resistor R3, and a fourth resistor R4. In some embodiments, each of the first transistor M1, the second transistor M2, the third transistor M3, the fourth transistor M4, and the fifth transistor M5 is PMOS or NMOS. For example, the first transistor M1 and the fifth transistor M5 are PMOS. The second transistor M2, the third transistor M3, and fourth transistor M4 are NMOS. The third resistor R3 and the fourth resistor R4 are the same kind of resistor, but resistance values of the third resistor R3 and the fourth resistor R4 are different.

In some embodiments, the control signal includes a first control signal S1 and a second control signal S2. The first transistor M1 is coupled to one of the first through-silicon vias, for example, the first through-silicon via 1410 shown in FIG. 1, and the first transistor M1 is configured to receive the first control signal S1. The second transistor M2 is coupled to the other one of the first through-silicon vias, for example, the first through-silicon via 1420 shown in FIG. 1, and the second transistor M2 is configured to receive the second control signal S2. Referring to FIG. 1 and FIG. 2, the second voltage detector 1310 decides whether the second rank 1300 is in an enable or a disable state according the first control signal S1 and the second control signal S2.

In some embodiments, please refer to FIG. 1 to FIG. 2, if each of the first control signal S1 and the second control signal S2 is at a low electrical potential, and the input voltage Vin is at a high electrical potential, the fourth rank 1700 is in an enable state. In some embodiments, the input voltage Vin at the high electrical potential is 4V (volt).

In some embodiments, please refer to FIG. 1 to FIG. 2, if the first control signal S1 is at a high electrical potential, the second control signal S2 is at a low electrical potential, and the input voltage Vin is at a middle electrical potential, the third rank 1600 is in an enable state. In some embodiments, the input voltage Vin at the middle electrical potential is 3V.

In some embodiments, please refer to FIG. 1 to FIG. 2, if each of the first control signal S1 and the second control signal S2 is at a high electrical potential, and the input voltage Vin is at a low electrical potential, the second rank 1300 is in an enable state. In some embodiments, the input voltage Vin at the low electrical potential is 2V.

Based on the above embodiments, the present disclosure provides the memory device 1000 to improve problems of power consumption in memory devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory device, comprising:
an input pad, configured to receive an input voltage;
a first rank;
a second rank;
a first voltage detector, disposed in the first rank, coupled to the input pad, configured to receive the input voltage, and configured to transmit the input voltage to the first rank;
a second voltage detector, disposed in the second rank, coupled to the first voltage detector through a first through-silicon via, and configured to receive the input voltage, and configured to transmit the input voltage to the second rank according to a control signal transmitted from the first voltage detector through the first voltage detector, so as to decide a state of the second rank, wherein the first rank and the second rank are located in different layers of the memory device, wherein the first rank is in an enable state;
a first logic gate, coupled between the first voltage detector and the first rank; and
a second logic gate, coupled between the second voltage detector and the second rank, and coupled to the first logic gate through a second through-silicon via, wherein the second logic gate is configured to receive a clock signal from the second through-silicon via to drive the second rank in an enable state.

2. The memory device of claim 1, wherein the memory device comprises a dynamic random access memory (DRAM).

3. The memory device of claim 1, wherein the first logic gate is coupled to the second logic gate through the second through-silicon via.

4. The memory device of claim 1, wherein each of the first logic gate and the second logic gate comprises at least one of logical NOR gate, logical OR gate, and logical AND gate.

5. The memory device of claim 1, wherein the first through-silicon via is perpendicular to the first rank, wherein the second through-silicon via is perpendicular to the second rank.

6. The memory device of claim 1, wherein the first through-silicon via comprises two first through-silicon vias, wherein the control signal comprises a first control signal and a second control signal, wherein the second voltage detector comprises:
a first transistor, coupled to one of the first through-silicon vias, and configured to receive the first control signal; and
a second transistor, coupled to the other one of the first through-silicon vias, and configured to receive the second control signal;
wherein the second voltage detector decides whether the second rank is in an enable or a disable state according the first control signal and the second control signal.

7. The memory device of claim 6, wherein if each of the first control signal and the second control signal is at a high electrical potential, and the input voltage is at a low electrical potential, the second rank is in an enable state.

8. The memory device of claim 7, wherein the first rank is a master rank, wherein the second rank is a slave rank controlled by the first rank.

9. The memory device of claim 8, further comprising:
a third rank;
a fourth rank;
a third voltage detector, disposed in the third rank, and coupled to the first through-silicon via; and
a fourth voltage detector, disposed in the fourth rank, and coupled to the first through-silicon via.

10. The memory device of claim 9, wherein each of the second rank, the third rank, and the fourth rank is controlled by the first rank.

11. The memory device of claim 9, wherein each of the first rank, the second rank, the third rank, and the fourth rank is located in different layers of the memory device.

12. The memory device of claim 10, wherein if each of the first control signal and the second control signal is at a low electrical potential, and the input voltage is at a high electrical potential, the fourth rank is in an enable state.

13. The memory device of claim 10, wherein if the first control signal and is at a high electrical potential, the second control signal is at a low electrical potential, and the input voltage is at a middle electrical potential, the third rank is in an enable state.

* * * * *